(12) United States Patent
Choi et al.

(10) Patent No.: US 12,272,543 B2
(45) Date of Patent: Apr. 8, 2025

(54) APPARATUS FOR TREATING SUBSTRATE AND METHOD FOR TREATING SUBSTRATE

(71) Applicant: SEMES CO., LTD., Cheonan-si (KR)

(72) Inventors: Yong Hyun Choi, Cheonan-si (KR); Young Hun Lee, Cheonan-si (KR); Seung Hoon Oh, Cheonan-si (KR); Mi So Park, Daejeon (KR); Tae Jong Choi, Anyang-si (KR); Yong Sun Ko, Suwon-si (KR); Jin Woo Jung, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 18/068,917

(22) Filed: Dec. 20, 2022

(65) Prior Publication Data

US 2023/0201884 A1    Jun. 29, 2023

(30) Foreign Application Priority Data

Dec. 24, 2021  (KR) .................. 10-2021-0186952
Feb. 15, 2022  (KR) .................. 10-2022-0019253

(51) Int. Cl.
  *H01L 21/02*  (2006.01)
  *B08B 3/02*   (2006.01)
  *F26B 5/00*   (2006.01)

(52) U.S. Cl.
  CPC ........ *H01L 21/02057* (2013.01); *B08B 3/022* (2013.01); *F26B 5/005* (2013.01)

(58) Field of Classification Search
  None
  See application file for complete search history.

(56) References Cited

U.S. PATENT DOCUMENTS

2015/0279708 A1* 10/2015 Kobayashi ........ H01L 21/67028
                                                        438/747
2018/0087836 A1*  3/2018 Yoshihara ................ F26B 3/20
2020/0168508 A1*  5/2020 Lee ................ H01L 21/823431

FOREIGN PATENT DOCUMENTS

CN    109390254 A    2/2019
CN    111524789 A    8/2020
JP    2015-088737 A  5/2015
(Continued)

OTHER PUBLICATIONS

Translation of KR102135941 by Lee, published Jul. 21, 2020.*
(Continued)

*Primary Examiner* — Mikhail Kornakov
*Assistant Examiner* — Ryan L Coleman
(74) *Attorney, Agent, or Firm* — Harness, Dickey & Pierce, P.L.C.

(57) ABSTRACT

The present invention provides a method for treating a substrate. The method for treating a substrate comprises: treating the substrate with liquid; and drying the liquid-treated substrate, and the liquid treatment step includes: a first liquid supply step of supplying a first liquid to an upper surface of the rotating substrate; and a second liquid supply step of supplying a second liquid to an upper surface of the rotating substrate, and in the second liquid supply step, a rotation speed of the substrate is adjusted such that the second liquid supplied on the substrate flows from a central region of the substrate to an edge region of the substrate.

7 Claims, 11 Drawing Sheets

(56) References Cited

FOREIGN PATENT DOCUMENTS

| JP | 2015-185767 A | 10/2015 |
|---|---|---|
| JP | 2017-005230 A | 1/2017 |
| KR | 101736845 B1 | 5/2017 |
| KR | 10-2019-0109328 A | 9/2019 |
| KR | 102135941 B1 | 7/2020 |
| WO | WO-2016121704 A1 | 8/2016 |
| WO | WO2020195474 * | 10/2020 |

OTHER PUBLICATIONS

Translation of WO2020195474 by Takahashi, published Oct. 1, 2020.*
Office Action dated Jul. 26, 2023 issued in corresponding Taiwanese Patent Application No. 111149286.
Japanese Office Action dated Dec. 19, 2023 issued in Japanese Patent Application No. 2022-181601.

* cited by examiner

APPARATUS FOR TREATING SUBSTRATE AND METHOD FOR TREATING SUBSTRATE

CROSS-REFERENCE TO RELATED APPLICATIONS

This application claims priority to and the benefit of Korean Patent Application Nos. 10-2021-0186952 and 10-2022-0019253 filed in the Korean Intellectual Property Office on Dec. 24, 2021, and Feb. 15, 2022, the entire contents of which are incorporated herein by reference.

TECHNICAL FIELD

The present invention relates to an apparatus for treating a substrate and a method for treating a substrate, and more particularly, to an apparatus for treating a substrate and a method for treating a substrate which can treat the substrate with liquid by supplying liquid to the substrate.

BACKGROUND ART

In general, various processes such as a photo process, an etching process, an ion implantation process, and a deposition process are performed to manufacture a semiconductor device.

In the process of performing each of the processes, various foreign substances such as particles, organic contaminants, and metal impurities are generated. The generated foreign substances may cause defects in a substrate and function as a factor that directly affects the performance and yield of the semiconductor device. Accordingly, before and after manufacture processes of the semiconductor device are performed, a cleaning process of removing the foreign substances remaining on the substrate is performed.

The cleaning process includes a step of removing foreign substances remaining on the substrate using a chemical, a step of removing the chemical remaining on the substrate using a cleaning liquid such as deionized water (DIW), a step of removing the cleaning liquid remaining on the substrate using an organic solvent with lower surface tension than the cleaning liquid, and a step of drying the organic solvent remaining on the surface of the substrate.

Various liquids used in the process of performing the cleaning process have fluidity. Accordingly, there is a problem in that the liquid supplied to the substrate may deviates from the substrate while transferring the substrate to perform a drying step. In addition, when an excessive amount of liquid is supplied to the substrate to remove particles remaining on the substrate, the liquid supplied to the substrate may deviate from the substrate. The liquid deviating from the substrate acts as a contamination source that contaminates a subsequent substrate in the process of transferring the substrate or due to the liquid remaining in the chamber.

SUMMARY OF THE INVENTION

The present invention has been made in an effort to provide an apparatus for treating a substrate and a method for treating a substrate which can efficiently clean the substrate.

The present invention has also been made in an effort to provide an apparatus for treating a substrate and a method for treating a substrate which can minimize a deviation of the liquid supplied to the substrate from an upper edge region of the substrate.

The object of the present invention is not limited thereto, and other objects not mentioned will be clearly understood by those of ordinary skill in the art from the following description.

An exemplary embodiment of the present invention provides a method for treating a substrate, including treating the substrate with liquid, and drying the liquid-treated substrate. The liquid treatment step includes a first liquid supply step of supplying a first liquid to an upper surface of the rotating substrate, and a second liquid supply step of supplying a second liquid to an upper surface of the rotating substrate, and in the second liquid supply step, a rotation speed of the substrate is adjusted such that the second liquid supplied on the substrate flows only from a central region of the substrate to an edge region of the substrate.

According to the exemplary embodiment, the second liquid supply step includes a replacement step of replacing the first liquid supplied to the substrate with the second liquid, a compensation step of compensating for the amount of the second liquid supplied to the substrate, and an induction step of inducing the second liquid supplied to the substrate to flow only to the edge region of the substrate by changing the rotation speed of the substrate in an induction speed range.

According to the exemplary embodiment, the first cleaning chamber may include a support unit configured to supports and rotates the substrate, a brush unit configured to clean the substrate supported by the support unit, and a liquid supply unit configured to supply a treatment liquid to the substrate supported by the support unit.

According to the exemplary embodiment, the induction step includes a first induction step of supplying the second liquid to the substrate rotating at a first induction speed, and a second induction step of stopping the supply of the second liquid to the substrate and rotating the substrate.

According to the exemplary embodiment, in the second induction step, the rotation speed of the substrate is changed from the first induction speed to a second induction speed, and the first induction speed is faster than the second induction speed.

According to the exemplary embodiment in the replacement step, the second liquid is supplied to the substrate rotating at a first speed, and in the compensation step, the second liquid is supplied to the substrate rotating at a second speed, and the first speed is faster than the second speed.

According to the exemplary embodiment, the second speed is faster than the first induction speed.

According to the exemplary embodiment, the second speed is a speed at which the second liquid supplied to the substrate is restricted from flowing to a rear surface of the substrate.

According to the exemplary embodiment, in the second liquid supply step, the second liquid flows only to an upper edge region of the substrate.

According to the exemplary embodiment, the drying step is performed by a supercritical fluid, and the second solution has a higher solubility of the supercritical fluid than the first solution.

According to the exemplary embodiment, the drying step is performed in a state in which a rear edge region of the substrate is supported.

According to the exemplary embodiment, the liquid treatment step is performed in a liquid treatment chamber, and the drying step is performed in a drying chamber, and in the liquid treatment chamber, the substrate on which the liquid treatment is completed is transferred to the drying chamber by a transfer robot.

Another exemplary embodiment of the present invention provides an apparatus for treating a substrate, including a liquid treatment chamber configured to treat the substrate with liquid by supplying the liquid to the substrate, a drying chamber configured to remove the liquid from the substrate, a transfer unit configured to transfer the substrate between the liquid treatment chamber and the drying chamber, and a controller configured to control the liquid treatment chamber, the drying chamber, and the transfer unit. The liquid treatment chamber includes a housing having an inner space, a support unit configured to support and rotate the substrate in the inner space, and, a liquid supply unit configured to supply a liquid to an upper surface of the substrate placed on the support unit, and the liquid supply unit includes: a first liquid supply nozzle configured to supply a first liquid to the substrate, and a second liquid supply nozzle configured to supply a second liquid to the substrate, and the controller is configured to control the first liquid supply nozzle and the second liquid supply nozzle, respectively, so as to supply the first liquid to the substrate and supply the second liquid to the substrate to which the first liquid is supplied, and control the support unit such that the second liquid supplied to the substrate flows only to the edge region of the substrate by adjusting a rotation speed of the substrate during the supply of the second liquid to the substrate.

According to the exemplary embodiment, the controller controls the support unit such that the rotation speed of the substrate is changed from a first speed to an induction speed slower than the first speed during the supply of the second liquid to the substrate, and the induction speed is a speed at which the second liquid supplied to the substrate flows only to an upper edge region of the substrate.

According to the exemplary embodiment, the induction speed includes a first induction speed and a second induction speed slower than the first induction speed, and the controller controls the support unit such that the rotation speed of the substrate is sequentially changed at the first speed, the first induction speed, and the second induction speed.

According to the exemplary embodiment, the controller controls the second liquid supply nozzle such that the second liquid is supplied to the substrate during the rotation of the substrate at the first speed and the first induction speed among the first speed, the first induction speed and the second induction speed.

According to the exemplary embodiment, the controller controls the support unit such that the rotation speed of the substrate is changed to a second speed slower than the first speed and faster than the induction speed, between the first speed and the induction speed.

According to the exemplary embodiment, the controller controls the second liquid supply nozzle so as to supply a second liquid to the substrate during the rotation of the substrate at the second speed.

According to the exemplary embodiment, the drying chamber includes a support for supporting the substrate, and the support supports a rear edge region of the substrate on which the liquid treatment is completed.

According to the exemplary embodiment, in the drying chamber, the second liquid is removed from the substrate using a supercritical fluid, and the second liquid has a higher solubility of the supercritical fluid than the first liquid.

In addition, another exemplary embodiment of the present invention provides a method for treating a substrate including a liquid treatment step of treating the substrate with liquid by supplying the liquid to the substrate in a liquid treatment chamber, a transfer step of transferring the liquid-treated substrate to a drying chamber; and a drying step of removing the liquid from the liquid-treated substrate using a supercritical fluid in the drying chamber. The liquid treatment step includes a first liquid supply step of supplying a first liquid to an upper surface of the rotating substrate; and a second liquid supply step of supplying a second liquid to an upper surface of the rotating substrate, and in the second liquid supply step, during the supply of the second liquid to the substrate, the rotation speed of the substrate is changed from a first speed to a second speed slower than the first speed, from the second speed to a first induction speed slower than the second speed, and from the first induction speed to a second induction speed slower than the first induction speed, such that the second liquid supplied to the substrate is induced to flow only to an edge region of the upper surface, and in the second liquid supply step, the second liquid supplied to the substrate is supplied while the substrate rotates at the first speed, the second speed and the first induction speed among the first speed, the second speed, the first induction speed, and the second induction speed.

According to the exemplary embodiment of the present invention, it is possible to efficiently clean a substrate.

Further, according to the exemplary embodiment of the present invention, it is possible to minimize deviation of a liquid supplied to the substrate from an upper edge region of the substrate.

The effect of the present invention is not limited to the foregoing effects, and the not-mentioned effects will be clearly understood by those skilled in the art from the present specification and the accompanying drawings.

DETAILED DESCRIPTION

Figure 1:
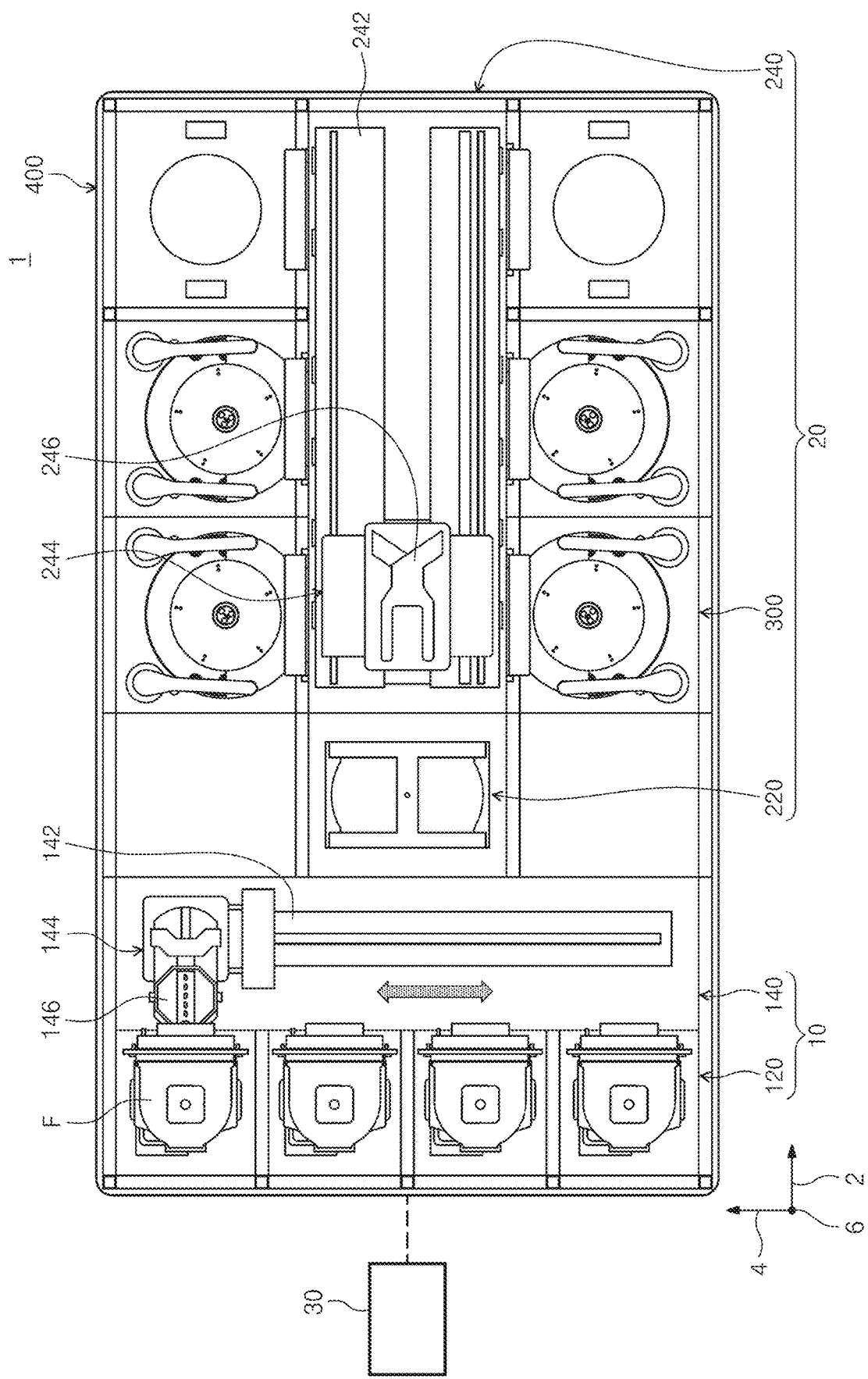
FIG. 1 is a view schematically illustrating one embodiment of an apparatus for treating a substrate according to the present invention.

Hereinafter, exemplary embodiments of the present invention will be described in more detail with reference to the accompanying drawings. An exemplary embodiment of the present invention may be modified in various forms, and the scope of the present invention should not be construed as being limited by the exemplary embodiment described below. The present exemplary embodiment is provided to more completely explain the present invention to those skilled in the art. Therefore, the shapes of components in the drawings are exaggerated to emphasize a clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

According to the exemplary embodiment, a process of treating a substrate W with liquid by supplying a liquid such as a cleaning liquid to the substrate W will be described as an example. However, this embodiment is not limited to the cleaning process, and may be applied to various processes of treating the substrate W using a liquid, such as an etching process, an ashing process, or a development process.

Hereinafter, one embodiment of the present invention will be described in detail with reference to FIGS. 1 to 16. An apparatus 1 for treating a substrate according to one embodiment of the present invention may perform a cleaning process including a drying process of drying the substrate W using a process fluid.

FIG. 1 is a view schematically illustrating one embodiment of an apparatus for treating a substrate according to the present invention. Referring to FIG. 1, the apparatus 1 for treating a substrate includes an index module 10 and a treatment module 20. According to the exemplary embodiment, the index module 10 and the treatment module 20 are disposed in one direction. Hereinafter, a direction in which the index module 10 and the treatment module 20 are disposed is defined as a first direction 2. When viewed from the top, a direction perpendicular to the first direction 2 is defined as a second direction 4, and a direction perpendicular to a plane including both the first direction 2 and the second direction 4 is defined as the third direction 6.

The index module 10 transfers the substrate W to the treatment module 20 that treats the substrate W from a container F in which the substrate W is accommodated. The index module 10 accommodates the substrate W that has been treated in the treatment module 20 in the container F. A longitudinal direction of the index module 10 is provided in the second direction 4. The index module 10 has a load port 120 and an index frame 140.

The container F in which the substrate W is accommodated is settled in the load port 120. The load port 120 is disposed on an opposite side of the treatment module 20 based on the index frame 140. A plurality of load ports 120 may be provided. The plurality of load ports 120 may be arranged in a line in the second direction 4. The number of load ports 120 may increase or decrease according to process efficiency and foot print conditions of the treatment module 20.

A plurality of slots (not illustrated) are formed in the container F. Slots (not illustrated) may be accommodated in a state in which the substrates W are arranged horizontally with respect to the ground. A sealed container such as a front opening unified pod (FOUP) may be used as the container F. The container F may be placed in the load port 120 by an operator or a transfer means (not illustrated), such as an overhead transfer, an overhead conveyor, or an automatic guided vehicle.

An index rail 142 and an index robot 144 are provided inside the index frame 140. A longitudinal direction of the index rail 142 is provided along the second direction 4 in the index frame 140. The index robot 144 may transfer the substrate W. The index robot 144 may transfer the substrate W between the index module 10 and a buffer unit 220 which will be described below.

The index robot 144 includes an index hand 146. The substrate W is settled on the index hand 146. The index hand 146 may be provided to be movable in the second direction 4 on the index rail 142. Accordingly, the index hand 146 may move forward and backward along the index rail 142. In addition, the index hand 146 may be provided to be rotatable with the third direction 6 as an axis. In addition, the index hand 146 may be provided to be vertically movable in the third direction 6. A plurality of index hands 146 may be provided. The plurality of index hands 146 may be provided to be spaced apart from each other in the vertical direction. A plurality of index hands 146 may move forward and backward, and rotate independently of each other.

A controller 30 may control the apparatus 1 for treating a substrate. The controller 30 has a process controller composed of a microprocessor (i.e., a computer) that executes the control of the apparatus 1 for treating a substrate, a keyboard through which an operator performs a command input operation to manage the apparatus 1 for treating a substrate, an user interface composed of a display that visualizes and displays an operation status of the apparatus 1 for treating a substrate, and a storage unit that stores a control program for executing a treatment executed in the apparatus 1 for treating a substrate under the control of a process controller, or a program for executing treatments in each component according to various data and treatment conditions, that is, a treatment recipe. In addition, the user interface and the storage unit may be connected to the process controller. The treatment recipe may be stored in a storage medium of the storage unit, and the storage medium may be a hard disk, a portable disk such as a CD-ROM or a DVD, or a semiconductor memory such as a flash memory.

The controller 30 may control the apparatus 1 for treating a substrate to perform a method for treating a substrate described below. For example, the controller 30 may perform a method for treating a substrate described below by controlling components provided in a liquid treatment chamber 300 described below.

The treatment module 20 includes a buffer unit 220, a transfer frame 240, a liquid treatment chamber 300, and a drying chamber 400. The buffer unit 220 provides a buffer space in which a substrate W taken into the treatment module 20 and a substrate W taken out from the treatment module 20 temporarily stay. The transfer frame 240 provides a transfer space for transferring the substrate W between the buffer unit 220, the liquid treatment chamber 300, and the drying chamber 400.

The liquid treatment chamber 300 may perform a liquid treatment process of treating the substrate W with liquid by supplying the liquid to the substrate W. The drying chamber 400 may perform a drying treatment to remove the liquid remaining on the substrate W. The liquid treatment chamber 300 and the drying chamber 400 may perform a cleaning process. The cleaning process may be performed in an order of the liquid treatment chamber 300 and the drying chamber 400. For example, in the liquid treatment chamber 300, the substrate W may be treated by supplying chemicals, a rinse liquid, and/or an organic solvent to the substrate W. For example, in the drying chamber 400, a drying treatment may be performed to remove the liquid remaining on the substrate W using a supercritical fluid.

The buffer unit 220 may be disposed between the index frame 140 and the transfer frame 240. The buffer unit 220 may be disposed on one end of the transfer frame 240. A slot (not illustrated) on which the substrate W is placed is provided inside the buffer unit 220. A plurality of slots (not illustrated) are provided. The plurality of slots (not illustrated) may be spaced apart from each other in the third direction 6. In the buffer unit 220, a front face and a rear face are opened. The front surface may be a surface facing the index module 10, and the rear surface may be a surface facing the carrier frame 240. The index robot 144 may access the buffer unit 220 through the front surface, and a transfer robot 244 which will be described below may access the buffer unit 220 through the rear surface.

A length direction of the transfer frame 240 may be provided along the first direction 2. A liquid treatment chamber 300 and a drying chamber 400 may be disposed on opposite sides of the transfer frame 240. The liquid treatment chamber 300 and the drying chamber 400 may be disposed in a side part of the transfer frame 240. The transfer frame 240 and the liquid treatment chamber 300 may be disposed in the second direction 4. In addition, the transfer frame 240 and the drying chamber 400 may be disposed in the second direction 4.

According to the exemplary embodiment, the liquid treatment chambers 300 are disposed in opposite sides of the transfer frame 240, and the drying chambers 400 are disposed on opposite sides of the transfer frame 240. The liquid treatment chambers 300 may be disposed at a position that is relatively closer to the buffer unit 220 than the drying chambers 400. The liquid treatment chambers 300 may be provided in an array of A×B (each of A and B is 1 or a natural number more than 1) in the first direction 2 and the third direction 6 in one side of the transfer frame 240. Here, A is the number of liquid treatment chambers 300 provided in a line in the first direction 2, and B is the number of liquid treatment chambers 300 provided in a line along the third direction 6. For example, when four liquid treatment chambers 300 are provided in one side of the transfer frame 240, the liquid treatment chambers 300 may be arranged in an array of 2×2. The number of the liquid treatment chambers 300 may increase or decrease. Unlike the aforementioned description, the liquid treatment chamber 300 may be provided only in one side of the transfer frame 240, and only the drying chambers 400 may be disposed in the other side opposite to one side. In addition, the liquid treatment chamber 300 and the drying chamber 400 may be provided in a single layer in one side and opposite sides of the transfer frame 240.

The transfer frame 240 has a guide rail 242 and a transfer robot 244. A length direction of the guide rail 242 is provided in the transfer frame 240 in the first direction 2. The transfer robot 244 may be provided to be linearly movable in the first direction 2 on the guide rail 242. The transfer robot 244 transfers the substrate W between the buffer unit 220, the liquid treatment chamber 300, and the drying chamber 400.

The transfer robot 244 includes a transfer hand 246 on which the substrate W is placed. The transfer hand 246 may be provided to be movable in the first direction 2 on the guide rail 242. Accordingly, the transfer hand 246 may move forward and backward along the guide rail 242. In addition, the transfer hand 246 may be provided to rotate around the third direction 6 as an axis and to be movable in the third direction 6. A plurality of transfer hands 246 may be provided. A plurality of transfer hands 246 may be provided to be spaced apart from each other in the vertical direction. A plurality of transfer hands 246 may move forward and backward, and rotate independently of each other.

The liquid treatment chamber 300 performs a liquid treatment process on the substrate W. For example, the liquid treatment chamber 300 may be a chamber that performs a cleaning process of removing process byproducts attached to the substrate W. The liquid treatment chamber 300 may have a different structure depending on the type of process of treating the substrate W. Alternatively, each of the liquid treatment chambers 300 may have the same structure.

Figure 2:
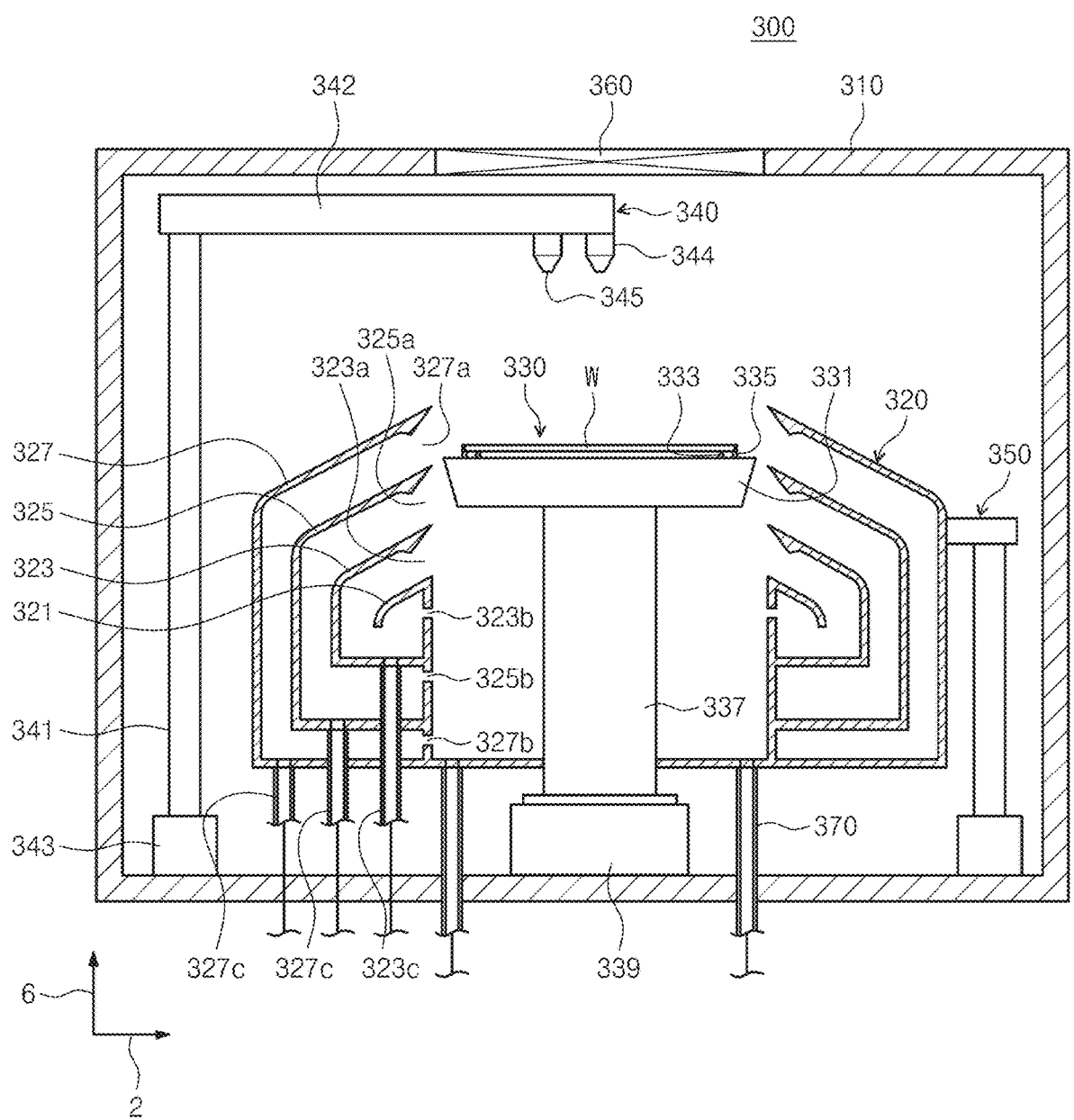
FIG. 2 is a view schematically illustrating one embodiment of a liquid treatment chamber of FIG. 1.

FIG. 2 is a view schematically illustrating one embodiment of a liquid treatment chamber of FIG. 1. Referring to FIG. 2, the liquid treatment chamber 300 includes a housing 310, a treatment container 320, a support unit 330, and a liquid supply unit 340.

The housing 310 has an inner space. The housing 310 is provided in a substantially rectangular parallelepiped shape. An opening (not illustrated) is formed in one side of the housing 310. The opening (not illustrated) functions as an entrance through which the substrate W is taken into or taken out of the inner space of the housing 310 by the transfer robot 244. The treatment container 320, the support unit 330, and the liquid supply unit 340 are disposed in the inner space of the housing 310.

The treatment container 320 has a treatment space with an upper part thereof opened. The treatment container 320 may be a bowl having a treatment space. The treatment container 320 may be provided to surround the treatment space. The treatment space of the treatment container 320 is provided as a space in which a support unit 330 described below supports and rotates the substrate W. The treatment space is provided as a space in which a liquid supply unit 340 described later supplies liquid to the substrate W and treats the substrate W.

According to the exemplary embodiment, the treatment container 320 may have a guide wall 321 and a plurality of collection cylinders 323, 325 and 327. Each of the collection cylinders 323, 325 and 327 separates and collects different liquids from the liquids used in treating the substrate W. Each of the collection cylinders 323, 325 and 327 may have a collection space for collecting the liquid used in treating the substrate W.

The guide wall 321 and the collection cylinders 323, 325, and 327 are provided in an annular ring shape surrounding the support unit 330. When the liquid is supplied to the substrate W, the liquid scattered by the rotation of the substrate W may be introduced into the collection space through inlets of each of the collection cylinders 323, 325 and 327a described below, that is, collection cylinders 323a, 325a and 327a. Different types of liquids may be introduced into each of the collection cylinders 323, 325 and 327.

The treatment container 320 has the guide wall 321, a first collection cylinder 323, a second collection cylinder 325, and a third collection cylinder 327. The guide wall 321 is provided in an annular ring shape surrounding the support unit 330. The first collection cylinder 323 is provided in an annular ring shape surrounding the guide wall 321. The second collection cylinder 325 is provided in an annular ring shape surrounding the first collection cylinder 323. The third collection cylinder 327 is provided in an annular ring shape surrounding the second collection cylinder 325.

A space between the guide wall 321 and the first collection cylinder 323 functions as a first inlet 323a through which liquid is introduced. A space between the first collection cylinder 323 and the second collection cylinder 325 functions as a second inlet 325a through which liquid is introduced. A space between the second collection cylinder 325 and the third collection cylinder 327 functions as a third inlet 327a through which liquid is introduced. The second inlet 325a may be disposed above the first inlet 323a, and the third inlet 327a may be disposed above the second inlet 325a. A liquid introduced into the first inlet 323a, a liquid introduced into the second inlet 325a, and a liquid introduced into the third inlet 327a may be different types of liquid.

A space between a lower end of the guide wall 321 and the first collection cylinder 323 functions as a first outlet 323b through which air and fume generated from the liquid are discharged. A space between a lower end of the first collection cylinder 323 and the second collection cylinder 325 functions as a second outlet 325b through which air and fume generated from the liquid are discharged. A space between a lower end of the second collection cylinder 325 and the third collection cylinder 327 functions as a third outlet 327b through which air and fume generated from the liquid are discharged. Fumes and air discharged from the first outlet 323b, the second outlet 325b, and the third outlet 327b are exhausted to the outside of the liquid treatment chamber 300 through an exhaust unit 370 described below.

Collection lines 323c, 325c and 327c extending vertically in a downward direction are connected to bottom surfaces of each of the collection cylinders 323, 325 and 327. Each of the collection lines 323c, 325c and 327c discharges the liquid introduced through each of the collection cylinders 323, 325 and 327. The discharged treatment liquid may be reused through an external liquid regeneration system (not illustrated).

The support unit 330 supports and rotates the substrate W within the treatment space. The support unit 330 may have a spin chuck 331, a support pin 333, a chuck pin 335, a rotation shaft 337, and a driver 339.

The spin chuck 331 has an upper surface provided in a substantially circular shape when viewed from the top. An upper surface of the spin chuck 331 may have a diameter larger than that of the substrate W.

A plurality of support pins 333 are provided. The support pins 333 are disposed on an upper surface of the spin chuck 331. The support pins 333 are spaced apart from each other by a predetermined interval on an upper surface edge part of the spin chuck 331. The support pins 333 are formed to protrude upward from the upper surface of the spin chuck 331. The support pins 333 are disposed to have an annular ring shape on the whole by a combination thereof. The support pin 333 supports a rear edge region of the substrate W such that the substrate W is spaced apart from the upper surface of the spin chuck 331 by a predetermined distance.

A plurality of chuck pins 335 are provided. The chuck pin 335 is disposed relatively farther from a central region of the spin chuck 331 than the support pin 333. The chuck pin 335 protrudes upward from the upper surface of the spin chuck 331. The chuck pin 335 supports a side part of the substrate W so as not to deviate from a regular position in a lateral direction when the substrate W is rotated. The chuck pin 335 is provided to be movable linearly between a waiting position and a support position in a radial direction of the spin chuck 331. The waiting position is defined as the position of the chuck pin 335 when the substrate W is received from the transfer robot 244 or the substrate W is handed over to the transfer robot 244. The support position is defined as the position of the chuck pin 336 when the process is performed on the substrate W. In the support position, the chuck pin 335 is in contact with the side part of the substrate W. The waiting position is disposed relatively farther from the central region of the spin chuck 331 than the support position.

The rotation shaft 337 is coupled to the spin chuck 331. The rotation shaft 337 is coupled to a lower surface of the spin chuck 331. A longitudinal direction of the rotation shaft 337 may be provided to face the third direction 6. The rotation shaft 337 is provided to be rotatable by receiving power from the driver 339. The rotation shaft 337 is rotated by the driver 339, and the spin chuck 331 is rotated through the rotation shaft 337. The driver 339 rotates the rotation shaft 337. The driver 339 may change the rotation speed of the rotation shaft 337. The driver 339 may be a motor that provides driving force. However, the present invention is not limited thereto, and the driver may be variously modified and provided as a known device providing the driving force.

The liquid supply unit 340 supplies the liquid to the substrate W. The liquid supply unit 340 supplies the liquid to the substrate W supported by the support unit 330. A plurality of liquids supplied by the liquid supply unit 340 to the substrate W is provided. According to the exemplary embodiment, the liquid supplied by the liquid supply unit 340 to the substrate W may include a first liquid and a second liquid. The first liquid and the second liquid may be sequentially supplied to the substrate W.

The liquid supply unit 340 may include a support rod 341, an arm 342, a driver 343, a first liquid supply nozzle 344, and a second liquid supply nozzle 345.

The support rod 341 is disposed in the inner space of the housing 310. The support rod 341 may be disposed in one side of the treatment container 320 in the inner space. A longitudinal direction of the support rod 341 may have a rod shape facing the third direction 6. The support rod 341 is provided to be rotatable by the driver 343 described below.

The arm 342 is coupled to an upper end of the support rod 341. The arm 342 extends vertically from a direction of length in the support rod 341. The longitudinal direction of the arm 342 may be formed in the third direction 6. A first liquid supply nozzle 344 and a second liquid supply nozzle 345, which will be described below, may be fixedly coupled to an end of the arm 342.

The arm 342 may be provided to move forward and backward in a longitudinal direction. The arm 342 may be swung by the driver 343 rotating the support rod 341 through the support rod 341. By the rotation of the arm 342, the first liquid supply nozzle 344 and the second liquid supply nozzle 345 may also be swung to allow a movement between the process position and the waiting position.

The process position can be a position where one of the first liquid supply nozzle 344 and the second liquid supply nozzle 345 faces the substrate W supported by the support unit 330. According to the exemplary embodiment, the process position may be a position where the center of one of the first liquid supply nozzle 344 and the second liquid supply nozzle 345 faces the center of the substrate W supported by the support unit 330. The waiting position may be a position where both the first liquid supply nozzle 344 and the second liquid supply nozzle 345 deviates from the process position.

The driver 343 is coupled to the support rod 341. The driver 343 may be disposed on a bottom surface of the housing 310. The driver 343 provides the driving force for rotating the support rod 341. The driver 343 may be provided as a known motor providing the driving force.

The first liquid supply nozzle 344 supplies the first liquid on the substrate W. The first liquid supply nozzle 344 may supply the first liquid to the substrate W supported by the support unit 330. The first liquid may be a liquid that removes a film or foreign substances remaining on the substrate W. According to the exemplary embodiment, the first liquid may be chemicals including an acid or alkali such as sulfuric acid ($H_2SO_4$), nitric acid ($HNO_3$), hydrochloric acid (HCl), etc.

The second liquid supply nozzle 345 supplies the second liquid on the substrate W. The second liquid supply nozzle 345 supplies the second liquid to the substrate W supported by the support unit 330. According to the exemplary embodiment, the second liquid may be a liquid that neutralizes the first liquid. According to the exemplary embodiment, the second liquid may be a liquid easily dissolved in a process fluid. In addition, the second liquid may be a liquid easily dissolved in the supercritical fluid used in the drying chamber 400 described below. According to the exemplary embodiment, the second liquid may be a liquid that is relatively more soluble in a process fluid described below than the first liquid. The second liquid in accordance with one embodiment can be provided as any one of pure water and alcohol such as isopropyl alcohol (IPA).

The liquid supply unit 340 according to the exemplary embodiment of the present invention has been described as an example in which both the first liquid supply nozzle 344 and the second liquid supply nozzle 345 are coupled to the arm 342, but the present invention is not limited thereto. For example, each of the first liquid supply nozzle 344 and the second liquid supply nozzle 345 may independently have an arm, a support rod, and a driver, and may independently swing and move forward and backward to allow a movement between the process position and the waiting position.

The liquid supply unit 340 according to the exemplary embodiment of the present invention has been described to have the first liquid supply nozzle 344 and the second liquid supply nozzle 345, but the present invention is not limited thereto. For example, the liquid supply unit 340 may include the first liquid supply nozzle 344, the second liquid supply nozzle 345, and a third liquid supply nozzle 346. The first liquid supplied from the first liquid supply nozzle 344 to the substrate W may be chemicals. The second liquid supplied from the second liquid supply nozzle 345 to the substrate W may be pure water. The third liquid supplied from the third liquid supply nozzle 346 to the substrate W may be an organic solvent containing isopropyl alcohol, etc.

A lifting unit 350 is disposed in the inner space of the housing 310. The lifting unit 350 adjusts a relative height between the treatment container 320 and the support unit 330. The lifting unit 350 may linearly move the treatment container 320 in the third direction 6. Accordingly, since the heights of the collection cylinders 323, 325 and 327 that collect the liquid vary depending on the type of liquid supplied to the substrate W, the liquids can be separated and collected. Unlike the above-mentioned description, the treatment container 320 is fixedly installed, and the lifting unit 350 may change a relative height between the support unit 330 and the treatment container 320 by vertically moving the support unit 330.

An airflow supply unit 360 supplies airflow to the inner space of the housing 310. The airflow supply unit 360 may supply downflow to the inner space. The airflow supply unit 360 may be provided as a fan filter unit. The airflow supply unit 360 may be installed on an upper part of the housing 310. The gas supplied to the inner space of the housing 310 through the airflow supply unit 360 forms downflow in the inner space. Byproducts or the like generated in the treatment space during the advancing of process are discharged to the outside of the housing 310 through the exhaust unit 370 described below by downflow formed in the inner space and the treatment space.

The exhaust unit 370 exhausts process byproducts such as fume and gas generated in the treatment space. The process byproducts such as fume and gas generated during the treatment of the substrate W with liquid by a pressure reducing unit (not illustrated) provided in the exhaust unit 370 are exhausted. The exhaust unit 370 may be coupled to a bottom surface of the treatment container 320. For example, the exhaust unit 370 may be disposed in a space between the rotation shaft 337 and an inner wall of the treatment container 320.

The drying chamber 400 removes the liquid remaining on the substrate W using a process fluid. According to the exemplary embodiment, the drying chamber 400 removes the second liquid remaining on the substrate W using the supercritical fluid. In the drying chamber 400, a supercritical process is performed using the characteristics of the supercritical fluid. Representative examples thereof include a supercritical drying process and a supercritical etching process. Hereinafter, the supercritical process will be described based on a supercritical drying process. However, since this is only for easy description, the drying chamber 400 may perform another supercritical process other than the supercritical drying process. According to the exemplary embodiment, supercritical carbon dioxide ($scCO_2$) may be used as the supercritical fluid.

Figure 3:
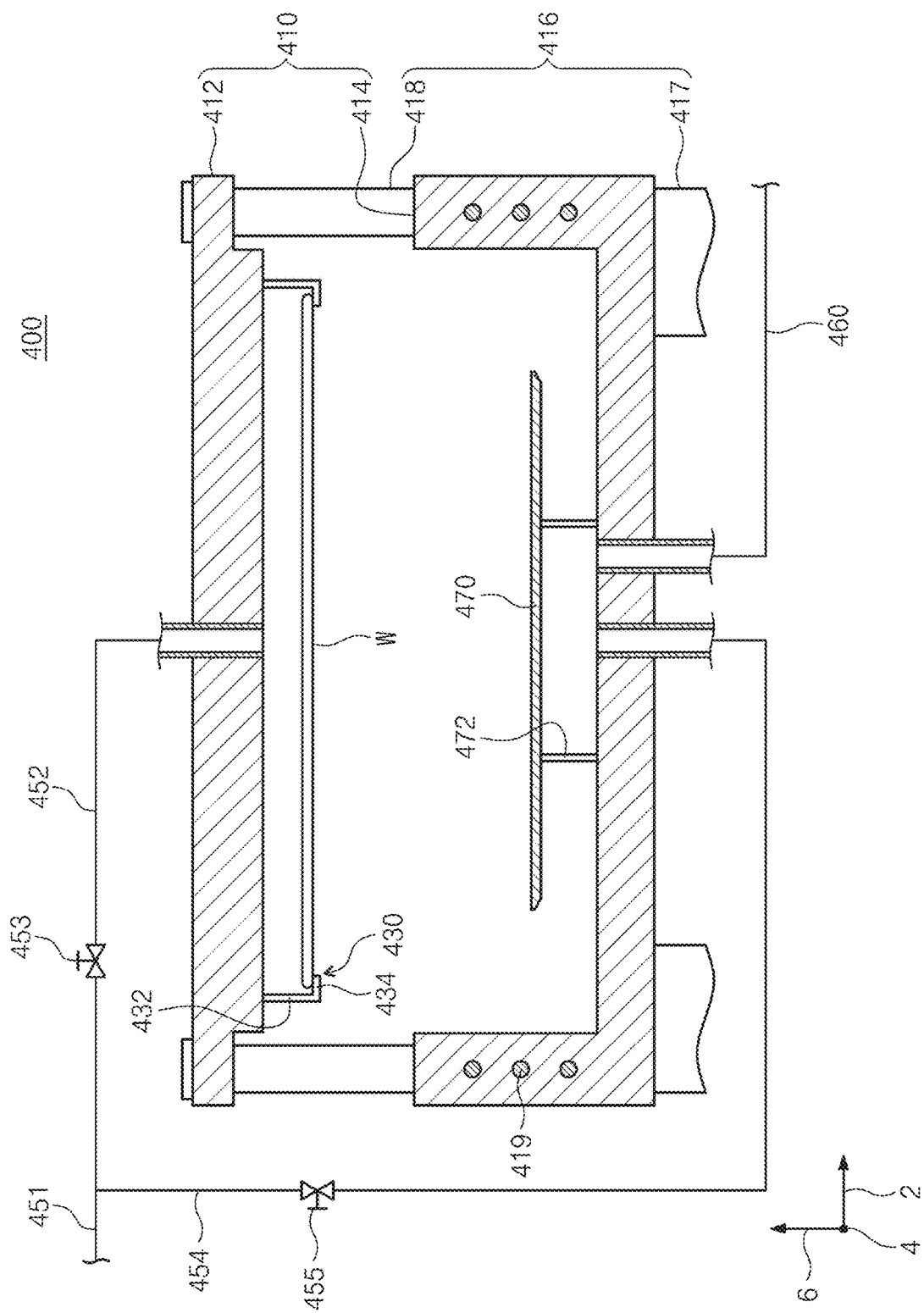
FIG. 3 is a view schematically illustrating one embodiment of a drying chamber of FIG. 1.

FIG. 3 is a view schematically illustrating one embodiment of the drying chamber of FIG. 1. Referring to FIG. 3, the drying chamber 400 may include a housing 410, a support 430, a fluid supply unit 450, an exhaust line 460, and a blocking plate 470. The housing 410 provides an inner space 401 in which drying treatment is performed on the substrate W. The housing 410 may include a first body 412, a second body 414, and a lifting member 416.

The first body 412 and the second body 414 are combined with each other to provide an inner space 401. The first body 412 may be disposed above the second body 414. The position of the first body 412 is fixed, and the second body 414 may be lifted by the lifting member 416 described below.

When the second body 414 descends and is spaced apart from the first body 412, the inner space 401 is opened. When the inner space 401 is opened, the substrate W may be taken into the inner space 401 or the substrate W may be taken out from the inner space 401. The substrate W taken into the inner space 401 may be a substrate W that has been treated with liquid in the liquid treatment chamber 300. According to the exemplary embodiment, the second liquid may remain in the substrate W taken into the inner space 401.

When the second body 414 ascends and is in close contact with the first body 412, the inner space 401 is sealed. When the inner space 401 is in a sealed state, a drying treatment on the substrate W may be performed by supplying the process fluid.

The lifting member 416 ascends and descends the second body 414. The lifting member 416 may include a lifting cylinder 417 and a lifting rod 418. The lifting cylinder 417 may be coupled to the second body 414. The lifting cylinder 417 may overcome a high pressure above a critical pressure of the inner space 401 during the drying of the substrate W and seal the inner space 401 by bringing the first body 412 and the second body 414 close to each other.

The lifting rod 418 generates a lifting force in the vertical direction. For example, the lifting rod 418 may generate a force moving in the third direction 6. A direction of length in the lifting rod 418 may be formed in a vertical direction. One end of the lifting rod 418 may be inserted into the lifting cylinder 417. The other end of the lifting rod 418 may be coupled to the first body 412. The second body 414 may be moved in a vertical direction by a relative lifting motion of the lifting cylinder 417 and the lifting rod 418. While the second body 414 is moved in the vertical direction, the lifting rod 418 prevents the first body 412 and the second body 414 from moving in the horizontal direction. The lifting rod 418 guides a vertical movement direction of the second body 414. The lifting rod 418 may prevent the first body 412 and the second body 414 from deviating from a regular position.

According to the exemplary embodiment of the present invention described above, it has been described that the second body 414 moves vertically to seal the inner space 401, but the present invention is not limited thereto. For example, the first body 412 and the second body 414 may be moved in a vertical direction, respectively. In addition, the first body 412 may move in the vertical direction, and the position of the second body 414 may be fixed.

Unlike the above-described example, the housing 410 may be provided as a single housing 410 in which an opening (not illustrated) through which the substrate W is taken in and out is formed at one side of the housing 410. A door (not illustrated) may be provided in the housing 410. The door (not illustrated) may move vertically to open and close the opening (not illustrated), and may keep the housing 410 sealed.

A heater 419 may be installed in the housing 410. According to the exemplary embodiment, the heater 419 may be embedded and installed inside at least one of the first body 412 and the second body 414. The heater 419 may heat the process fluid supplied to the inner space 401 above a critical temperature and maintain the same in a supercritical fluid phase, or may heat the process fluid to be in the supercritical fluid phase again when the process fluid is liquefied.

The support 430 supports the substrate W in the inner space 401. The support 430 may be fixedly installed on a lower surface of the first body 412. The support 430 may have a fixing rod 432 and a holder 434.

The fixing rod 432 may be fixedly installed on the first body 412 so as to protrude downwardly from a bottom surface of the first body 412. A direction of length in the fixing rod 432 is provided in a vertical direction. A plurality of fixing rods 432 may be provided. The plurality of fixing rods 432 are spaced apart from each other. When the substrate W is taken into or taken out of a space surrounded by the plurality of fixing rods 432, the plurality of fixing rods 432 are disposed in a position where they do not interfere with the substrate W. Holders 434 are coupled to each of the fixing rods 432.

The holder 434 extends from the fixing rod 432. The holder 434 may extend from a lower end of the fixing rod 432 to a space surrounded by the fixing rods 432. The holder 434 supports a rear edge region of the substrate W. For example, a rear surface of the substrate W may be a surface on which a pattern is not formed, and an upper surface of the substrate W may be a surface on which a pattern is formed. Due to the above-described structure, an edge region of the substrate W taken into the inner space 401 may be placed on the holder 434. In addition, part of the entire upper surface region of the substrate W, a center region of the bottom surface of the substrate W, and an edge region of the bottom surface of the substrate W may be exposed to the process fluid supplied to the inner space 401.

The fluid supply unit 450 supplies the process fluid to the inner space 401. The process fluid according to one embodiment may be supplied to the inner space 401 in a supercritical state. However, the present invention is not limited to this, and the process fluid may be supplied to the inner space 401 in a gaseous state, and be phase-changed into a supercritical state in the inner space 401. The fluid supply unit 450 may have a main supply line 451, a first branch line 452, and a second branch line 454.

One end of the main supply line 451 is connected to a supply source (not illustrated) in which the process fluid is stored. The other end of the main supply line 451 is branched into the first branch line 452 and the second branch line 454. The first branch line 452 is connected to an upper surface of the housing 410. According to the exemplary embodiment, the first branch line 452 may be connected to the first body 412. For example, the first branch line 452 may be coupled to a central part of the first body 412. The first branch line 452 may be disposed in an upper central region of the substrate W placed on the support 430. A first valve 453 may be installed on the first branch line 452. The first valve 453 may be provided as an opening/closing valve. The process fluid may be selectively supplied to the inner space 401 according to the opening or closing of the first valve 453.

The second branch line 454 is connected to a lower surface of the housing 410. According to the exemplary embodiment, the second branch line 454 may be connected to the second body 414. For example, the second branch line 454 may be coupled to a central part of the second body 414. The second branch line 454 may be disposed vertically below the central region of the substrate W placed on the support 430. A second valve 455 may be installed in the second branch line 454. The second valve 455 may be provided as an opening/closing valve. The process fluid may be selectively supplied to the inner space 401 according to the opening or closing of the second valve 455.

The exhaust line 460 exhausts an atmosphere of the inner space 401. The exhaust line 460 may be coupled to the second body 414. According to the exemplary embodiment, the exhaust line 460 may be dislocated from the center of a lower surface of the second body 414 when viewed from the top. The supercritical fluid flowing through the inner space 401 is discharged to the outside of the housing 410 through the exhaust line 460.

The blocking plate 470 is disposed in the inner space 401. The blocking plate 470 may be provided to overlap an outlet of the second branch line 454 and an inlet of the exhaust line 460 when viewed from the top. The blocking plate 470 can prevent damage to the substrate W by directly discharging the process fluid supplied through the second branch line 454 toward the substrate W.

The blocking plate 470 may be spaced apart upwardly from a bottom surface of the housing 410 by a predetermined distance. For example, the blocking plate 470 may be supported by the support 472 to get spaced apart from the bottom surface of the housing 410 in an upward direction. The support 472 may be provided in a rod shape. A plurality of supports 472 may be provided. The plurality of supports 472 are spaced apart from each other by a predetermined distance.

Hereinafter, a method for treating a substrate according to the exemplary embodiment of the present invention will be described in detail. The method for treating a substrate described below may be performed by a transfer robot 244, a liquid treatment chamber 300, and a drying chamber 400. In addition, the controller 30 may perform the method for treating a substrate described below by controlling the components of the transfer robot 244, the liquid treatment chamber 300, and the drying chamber 400.

Figure 4:
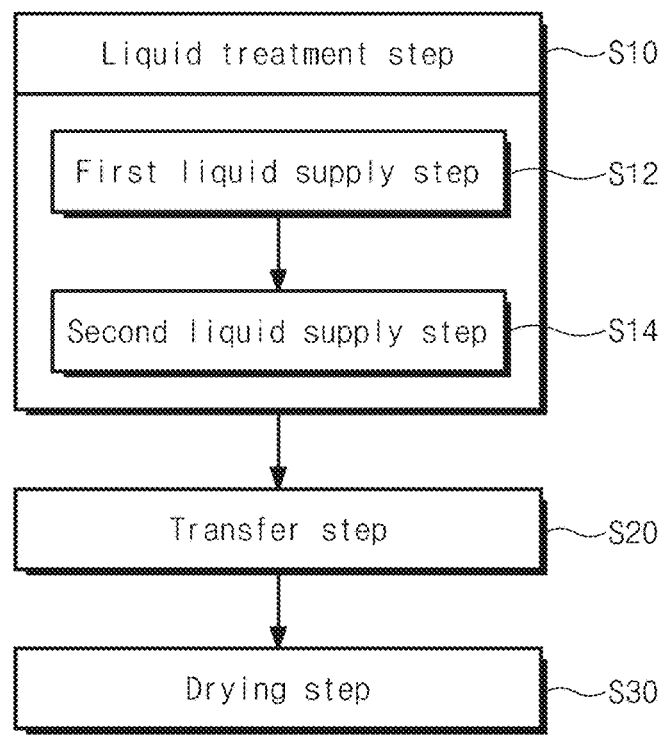
FIG. 4 is a flowchart of a method for treating a substrate according to one embodiment of the present invention.

FIG. 4 is a flowchart of the method for treating a substrate according to one embodiment of the present invention. Referring to FIG. 4, the method for treating a substrate according to the exemplary embodiment includes a liquid treatment step S10, a transfer step S20, and a drying step S30. The liquid treatment step S10, the transfer step S20, and the drying step S30 may be sequentially performed. In addition, the liquid treatment step S10, the transfer step S20, and the drying step S30 may be collectively defined as a cleaning process.

The liquid treatment step S10 is performed in the liquid treatment chamber 300. In the liquid treatment step S10, the liquid is supplied to the substrate W to treat the substrate W with liquid. According to the exemplary embodiment, the liquid treatment step S10 may include a first liquid supply step S12 and a second liquid supply step S14.

In the first liquid supply step S12, the substrate W may be treated by supplying the first liquid to the substrate W. The first liquid may be chemicals including an acid such as sulfuric acid ($H_2SO_4$), nitric acid ($HNO_3$) and hydrochloric acid (HCl) or alkali. In the second liquid supply step S14, the substrate W may be treated by supplying the second liquid to the substrate W. The second liquid may be provided as any one of pure water and alcohols such as isopropyl alcohol (IPA). The first liquid and the second liquid may be sequentially supplied to the substrate W.

The transfer step S20 is performed by the transfer robot 244. In the transfer step S20, the transfer robot 244 transfers the substrate W from the liquid treatment chamber 300 to the drying chamber 400. In the transfer step S20, the substrate W on which the liquid treatment step S10 is completed in the liquid treatment chamber 300 is transferred to the drying chamber 400.

The drying step S30 is performed in the drying chamber 400. In the transfer step S20, the substrate W transferred by the transfer robot 224 in the transfer step S20 is taken into the inner space 401 of the drying chamber 400. In the drying step S30, the process fluid is supplied to the substrate W taken into the drying chamber 400 to remove the liquid remaining on the substrate W.

Hereinafter, a process of treating the substrate W through a liquid treatment step S10, a transfer step S20, and a drying step S30 according to the exemplary embodiment of the present invention will be described in detail with reference to FIGS. 5 to 16.

Figure 5:
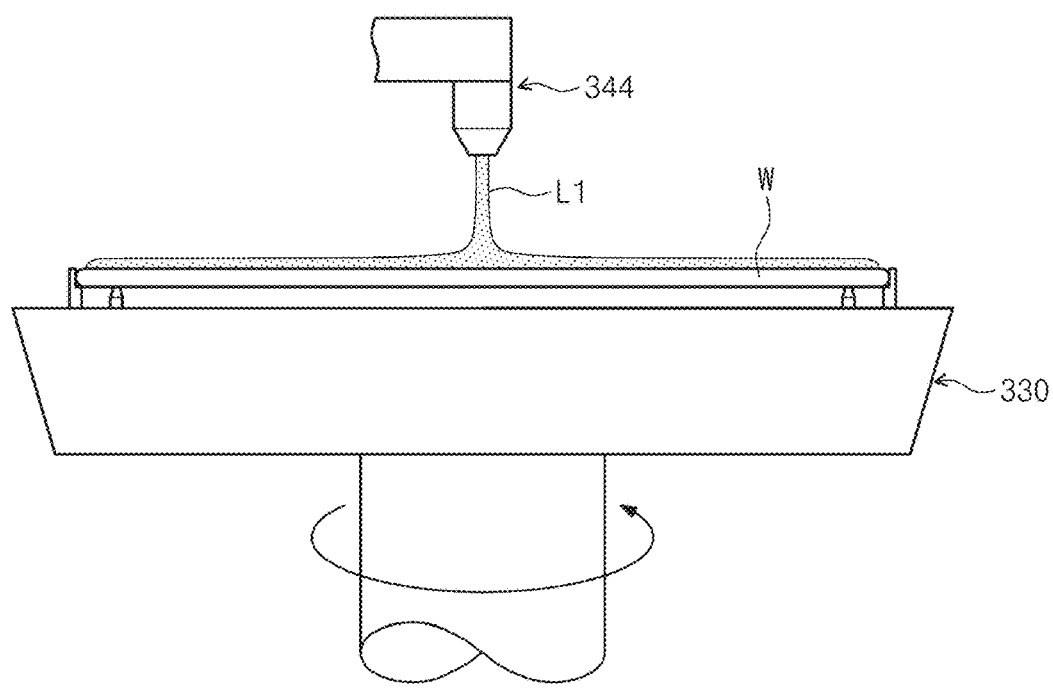
FIG. 5 is a view schematically illustrating a state of treating a substrate in a first liquid supply step according to one embodiment of FIG. 4.

FIG. 5 is a view schematically illustrating a state of treating a substrate in the first liquid supply step according to one embodiment of FIG. 4. Referring to FIG. 5, in the first liquid supply step S12, a first liquid L1 is supplied to the substrate W. In the first liquid supply step S12, the first liquid supply nozzle 344 may be disposed in a region opposite to the central region of the rotating substrate W, and the first liquid supply nozzle 344 may supply the first liquid to the central region of the substrate W. According to the exemplary embodiment, in the first liquid supply step S12, the first liquid may be supplied to the center of the substrate W.

Figure 6:
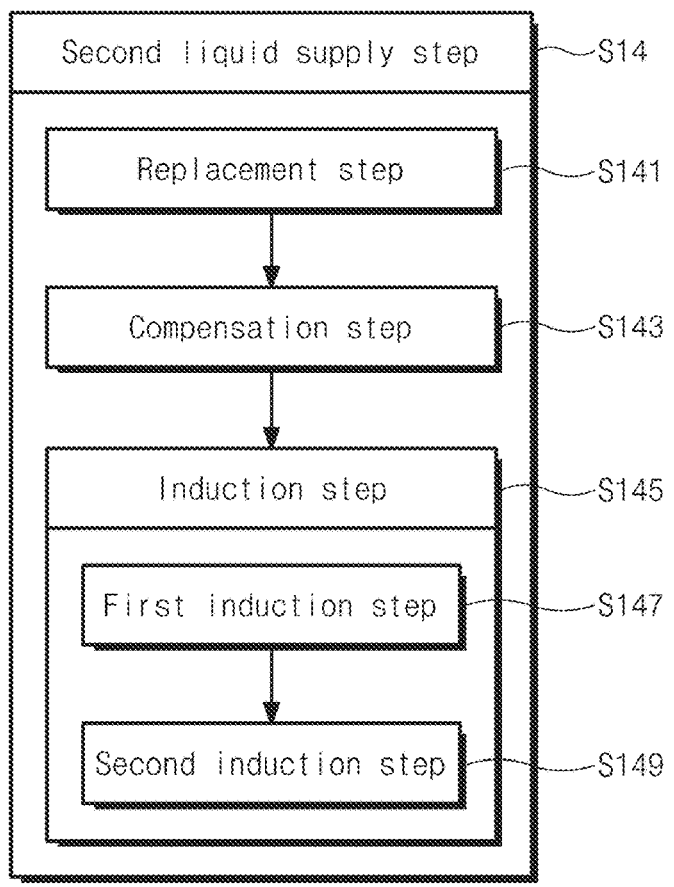
FIG. 6 is a flowchart of a second liquid supply step according to one embodiment of FIG. 4.
Figure 7:
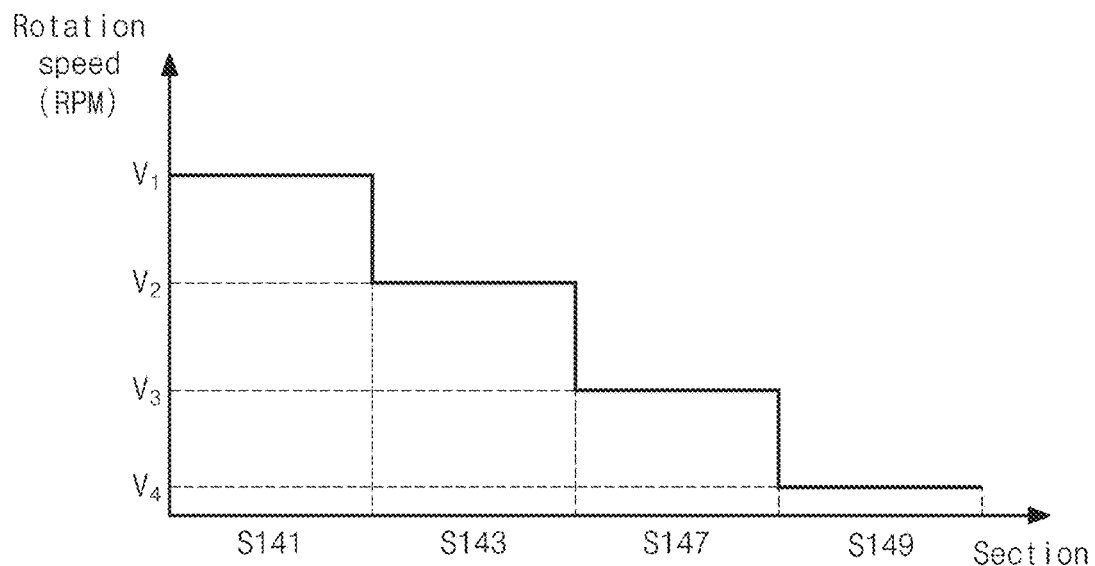
FIG. 7 is a view illustrating one embodiment of a rotation speed of the substrate in the second liquid supply step of FIG. 6.

FIG. 6 is a flowchart of the second liquid supply step according to the exemplary embodiment of FIG. 4. FIG. 7 is a diagram illustrating exemplary embodiment of a rotation speed of the substrate in the second liquid supply step of FIG. 6. FIGS. 8 to 13 are views sequentially illustrating a state in which a substrate is treated in each step included in the second liquid supply step.

Hereinafter, a process in which the substrate W is treated in the second liquid processing step will be described in detail with reference to FIGS. 6 to 13.

In the second liquid supply step S14, a second liquid L2 is supplied to the substrate W. In the second liquid supply step S14, the second liquid supply nozzle 345 is disposed in the region opposite to the central region of the rotating substrate W, and the second liquid supply nozzle 345 supplies the second liquid L2 to the central region of the substrate W. According to the exemplary embodiment, in the second liquid supply step S14, the second liquid L2 may be supplied to the center of the substrate W. In the second liquid supply step S14, the rotation speed of the substrate W is adjusted such that the second liquid L2 supplied to the center region of the substrate W flows only from the center region of the substrate W to the edge region of the substrate W.

Referring to FIG. 6, the second liquid supply step S14 may include a replacement step S141, a compensation step S143, and an induction step S145. The induction step S145 may include a first induction step S147 and a second induction step S149. The replacement step S141, the compensation step S143, and the first induction step S147, and the second induction step S149 may be sequentially performed in the liquid treatment chamber 300.

In the replacement step S141, the second liquid L2 is supplied to the rotating substrate W. According to the exemplary embodiment, in the replacement step S141, the second liquid L2 may be supplied to the center region of the substrate W rotating at a first speed V1. In the compensation step S143, the second liquid L2 is supplied to the rotating substrate W. According to the exemplary embodiment, the second liquid L2 may be supplied to the center region of the substrate W rotating at a second speed V2.

In the induction step S145, a flow region of the second liquid L2 supplied to the substrate W may be adjusted by changing the rotation speed of the substrate W. According to the exemplary embodiment, in the induction step S145, the rotation speed of the substrate W may be changed within an induction speed range to induce the second liquid L2 supplied to the substrate W to flow only to the edge region of the substrate W.

The first induction step S147 supplies the second liquid L2 to the rotating substrate W. According to the exemplary embodiment, the first induction step S147 may supply the second liquid L2 to the center region of the substrate W rotating at a first induction speed V3. In the second induction step S149, the substrate W may be rotated. For example, in the second induction step S149, the supply of the second liquid L2 to the substrate W may be stopped and the substrate W may be rotated at a second induction speed V4.

Hereinafter, the rotation speed of the substrate W in the replacement step S141, the compensation step S143, the first induction step S147, and the second induction step S149 according to the exemplary embodiment of the present invention described with reference to FIG. 7 will be described based on a relative numerical relationship rather than an absolute value for convenience of explanation.

Referring to FIG. 7, in the replacement step S141, the substrate W may be rotated at the first speed V1. In the compensation step S143, the substrate W may rotate at the second speed V2. In the first induction step S147, the substrate W may rotate at the first induction speed V3. In the second induction step S149, the substrate W may rotate at the second induction speed V4. According to the exemplary embodiment, the first speed V1 may be faster than the second speed V2. Further, the second speed V2 may be faster than the first induction speed V3. Furthermore, the first induction speed V3 may be faster than the second induction speed V4. Optionally, the first induction speed V3 may be the same as the second induction speed V4.

Figure 8:
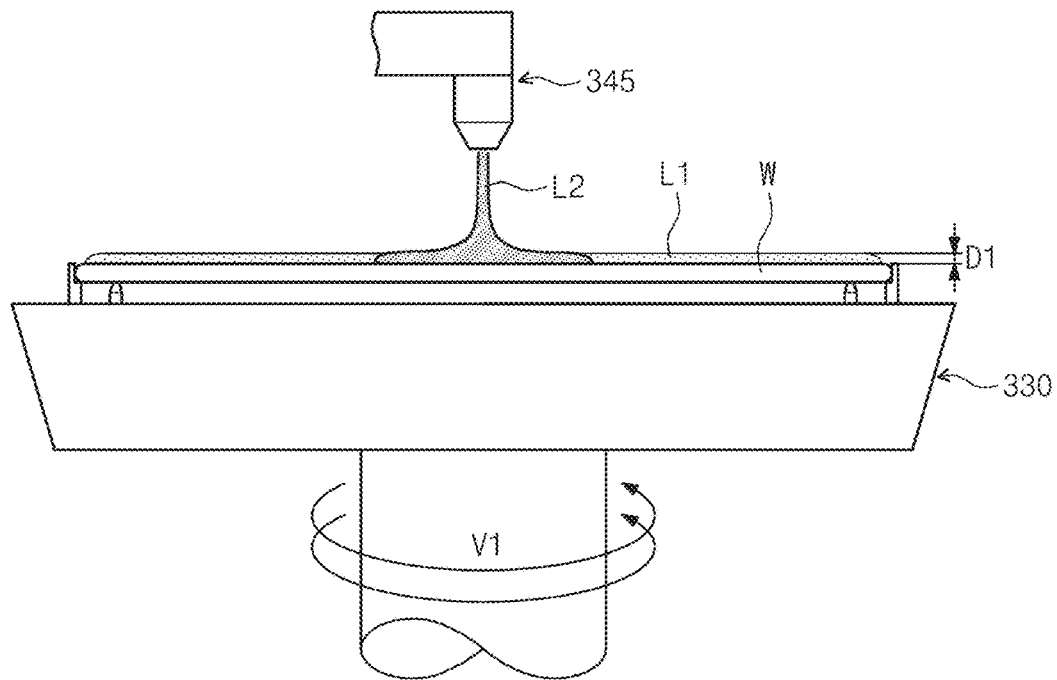
FIG. 8 is a view schematically illustrating a state of treating the substrate in a replacement step according to one embodiment of FIG. 6.

Referring to FIG. 8, in the replacement step S141, the second liquid L2 is supplied to the substrate W rotating at a first speed V1, and in the first liquid supply step S12, the first liquid L1 previously supplied to the substrate W is replaced with the second liquid L2. In the replacement step S141, the second liquid L2 may be supplied to the substrate W in an amount that does not exceed the edge of the substrate W. According to the exemplary embodiment, the replacement step S141 may be performed until all of the first liquid L1 previously supplied to the substrate W is replaced with the second liquid L2. After the replacement step S141 is completed, the second liquid L2 supplied to the upper surface of the substrate W may have a first thickness D1.

Figure 9:
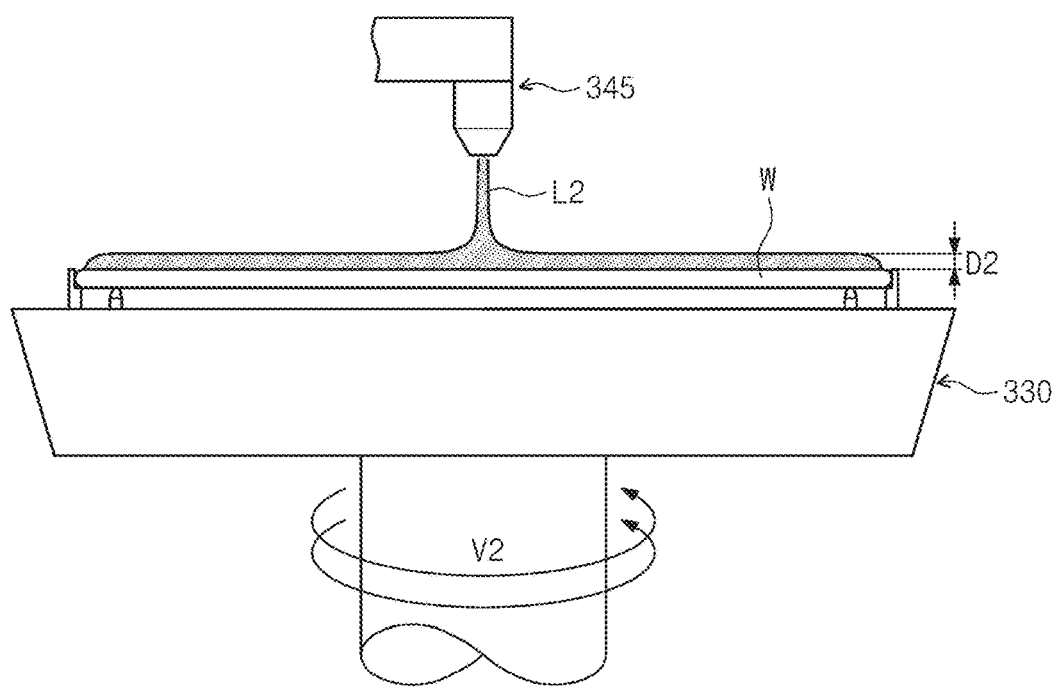
FIG. 9 is a view schematically illustrating a state of treating the substrate in a compensation step according to one embodiment of FIG. 6.

Referring to FIG. 9, in the compensation step S143, the second liquid L2 may be supplied to the substrate W rotating at the second speed V2 to compensate for the amount of the second liquid L2 previously supplied in the replacement step S141. In the compensation step S143, the second liquid L2 may be further supplied to the substrate W to increase the thickness of the second liquid L2 previously supplied to the upper surface of the substrate W. For example, after completing the compensation step S143, the second liquid L2 supplied to the upper surface of the substrate W may have a second thickness D2. According to the exemplary embodiment, the amount of the second liquid L2 supplied to the substrate W in the compensation step S143 may be relatively smaller than the amount of the second liquid L2 supplied to the substrate W in the replacement step S141.

In the compensation step S143, the amount of the second liquid L2 previously supplied to the substrate W is increased by supplying the second liquid L2 to the upper surface of the substrate W, but the amount of the second liquid L2 supplied to the substrate W may be adjusted such that the second liquid L2 does not permeate the rear surface of the substrate W. In addition, the second speed V2 at which the substrate W rotates in the compensation step S143 may be a speed at which the second liquid L2 supplied to the substrate W is restricted from flowing to the rear surface of the substrate W.

Figure 10:
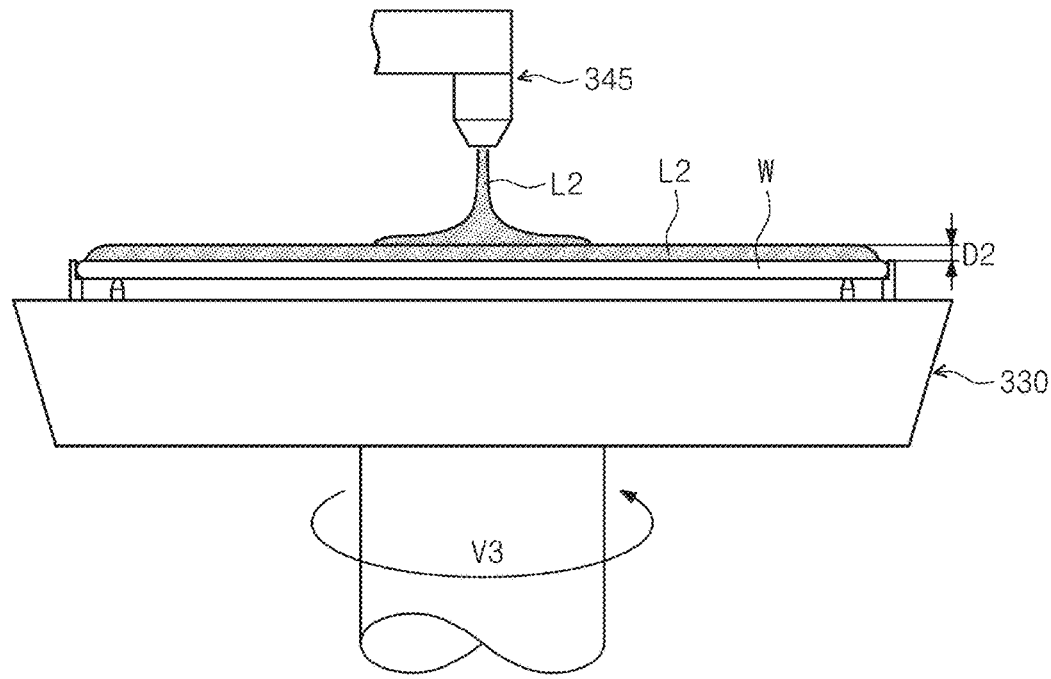
FIG. 10 is a view schematically illustrating a state of treating the substrate in a first induction step according to one embodiment of FIG. 6.

Referring to FIG. 10, in the first induction step S147, the second liquid L2 may be supplied to the substrate W rotating at the first induction speed V3. For example, in the first induction step S147, the second liquid L2 may be supplied to a region including the center of the substrate W. The first induction speed V3 is slower than the first speed V1 and the second speed V2. The second liquid L2 supplied to the substrate W that rotates relatively slowly may flow only in a region including the center of the substrate W.

Figure 11:
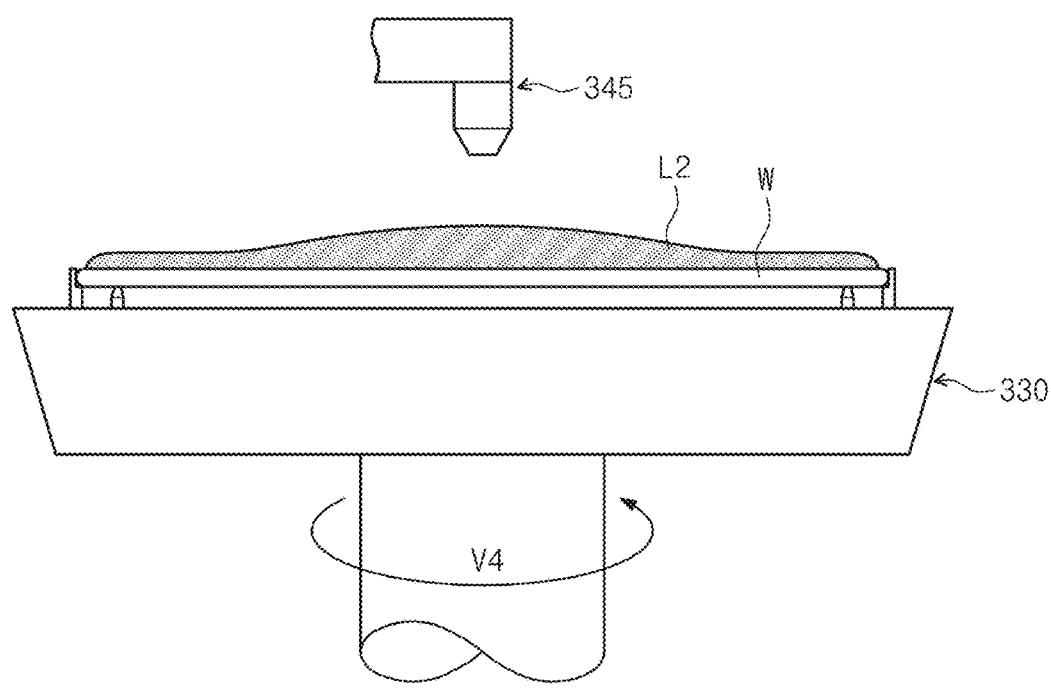
FIGS. 11 and 12 are views schematically illustrating a state of treating the substrate in a second induction step according to one embodiment of FIG. 6.
Figure 12:
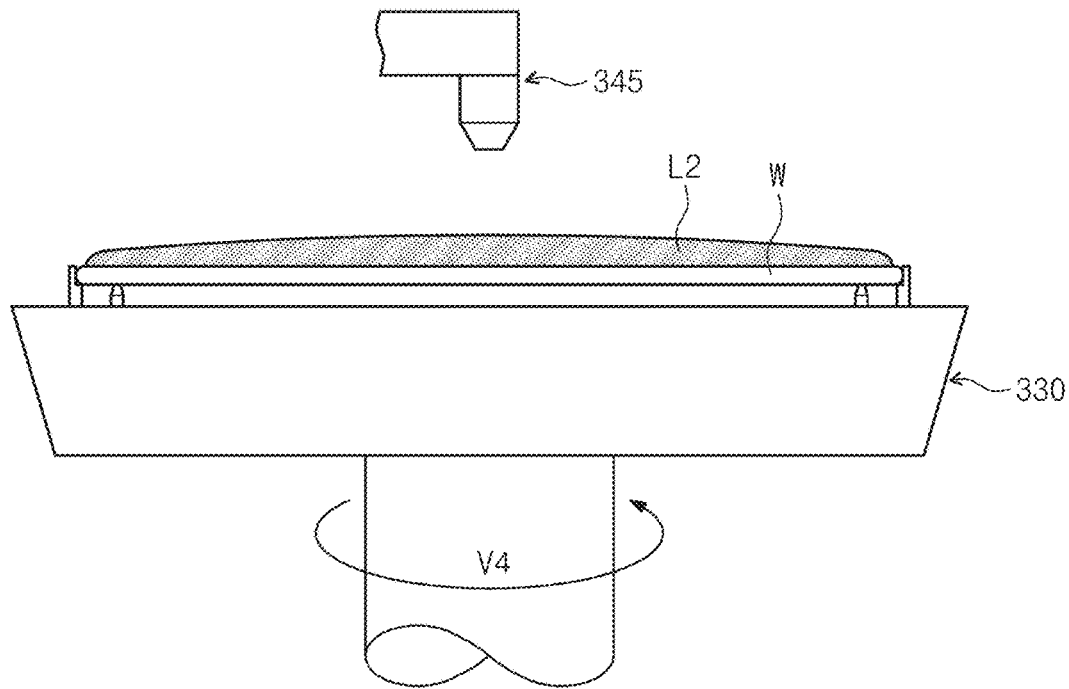

Referring to FIGS. 11 and 12, in the second induction step S149, the supply of the second liquid L2 to the substrate W is stopped and the second liquid supply nozzle 345 may be moved from the process position to the waiting position. In the second induction step S149, the substrate W may be rotated at the second induction speed V4. The second induction speed V4 may be a speed at which the second liquid L2 previously supplied to the substrate W is restricted from permeating into the rear surface of the substrate W in the first induction step S147. That is, the second induction speed V4 may be a speed at which the second liquid L2 previously supplied to the central region of the substrate W flows only to an upper edge of the substrate W in the first induction step S147. Accordingly, in the second induction step S149, the substrate W may be rotated at a speed equal to or slower than the first induction speed V3 to allow the second liquid L2 supplied to the central region of the substrate W to flow to the edge region of the substrate W in the first induction step S149. For example, in the second induction step S149, the second liquid L2 discharged to the region including the center of the substrate W in the first induction step S147 may flow only to the upper edge region of the substrate W. Since the substrate W rotates at a slow speed in the second induction step S149, a puddle in which the second liquid L2 formed in the central region of the substrate W is relatively thicker than the second liquid L2 formed in the edge region of the substrate W may be formed by centrifugal force.

Figure 13:
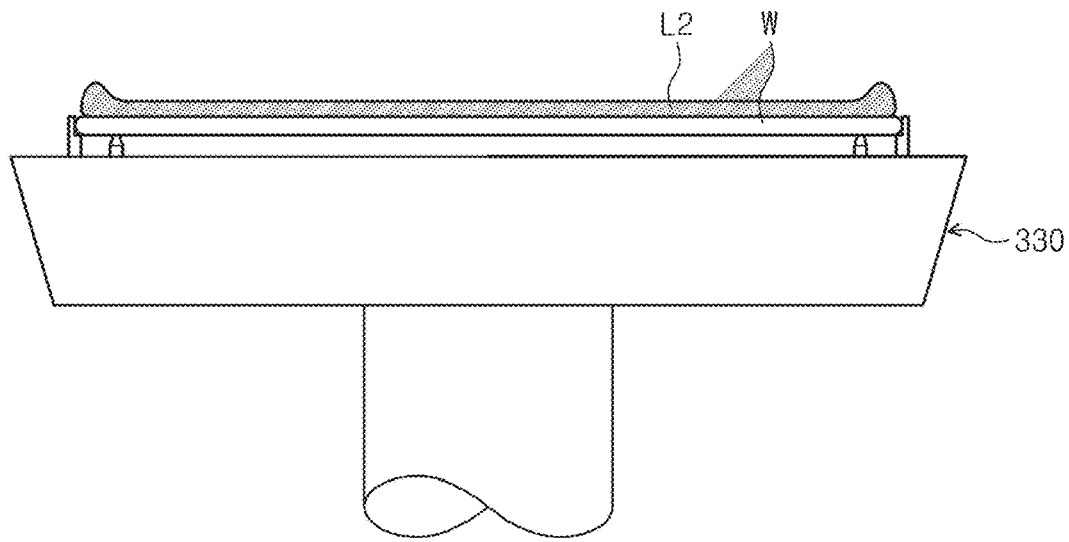
FIG. 13 is a view schematically illustrating a state of the substrate in which the second liquid supply step of FIG. 6 is completed.

Referring to FIG. 13, the second liquid L2 that is flowing in the central region of the substrate W during the second induction step S149 gradually moves to the edge region of the substrate W. Since the substrate W rotates at a slow speed of the second induction speed V4 in the second induction step S149, the second liquid L2 supplied to the central region of the substrate W may not deviate from the edge region of the substrate W. Furthermore, since the second liquid L2 flows from the center region of the substrate W to the edge region of the substrate W during the second induction step S149, the edge region of the substrate W may have a relatively higher thickness of the second liquid L2 than the center region of the substrate W after the second induction step S149 is completed.

Figure 14:
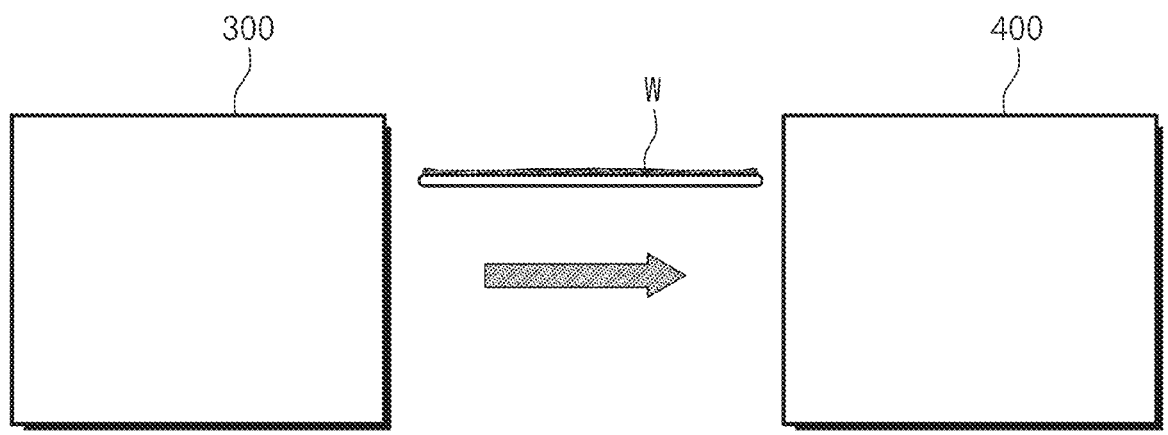
FIG. 14 is a diagram schematically illustrating a state in which a substrate is transferred in a transfer step according to one embodiment of FIG. 4.

FIG. 14 is a diagram schematically illustrating a state in which a substrate is transferred in the transfer step according to one embodiment of FIG. 4. Referring to FIG. 14, the transfer step S20 is performed by the transfer robot 244. In the transfer step S20, after the liquid treatment on the substrate W is completed in the liquid treatment chamber 300, the substrate W is transferred from the liquid treatment chamber 300 to the drying chamber 400. While the substrate W is transferred by the transfer robot 244, the liquid remains on the substrate W. According to the liquid treatment step S10 according to the exemplary embodiment of the present invention, when the transfer robot 244 transfers the substrate W, since the permeation of the liquid into the rear surface of the substrate W can be minimized, the liquid may not remain in the rear surface of the substrate W.

Figure 15:
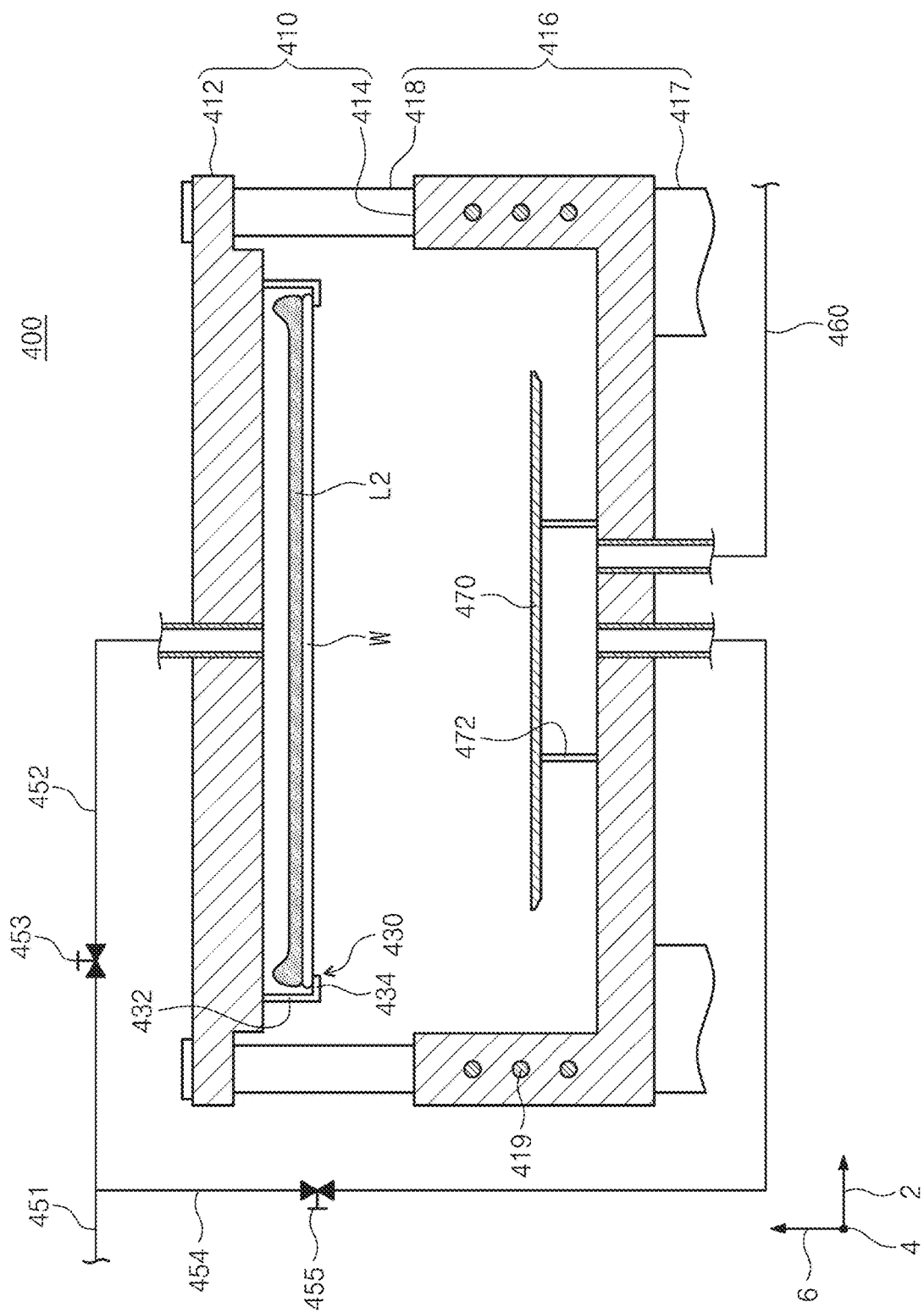
FIGS. 15 and 16 are views schematically illustrating a state in which the substrate is treated in a drying step according to one embodiment of FIG. 4.
Figure 16:
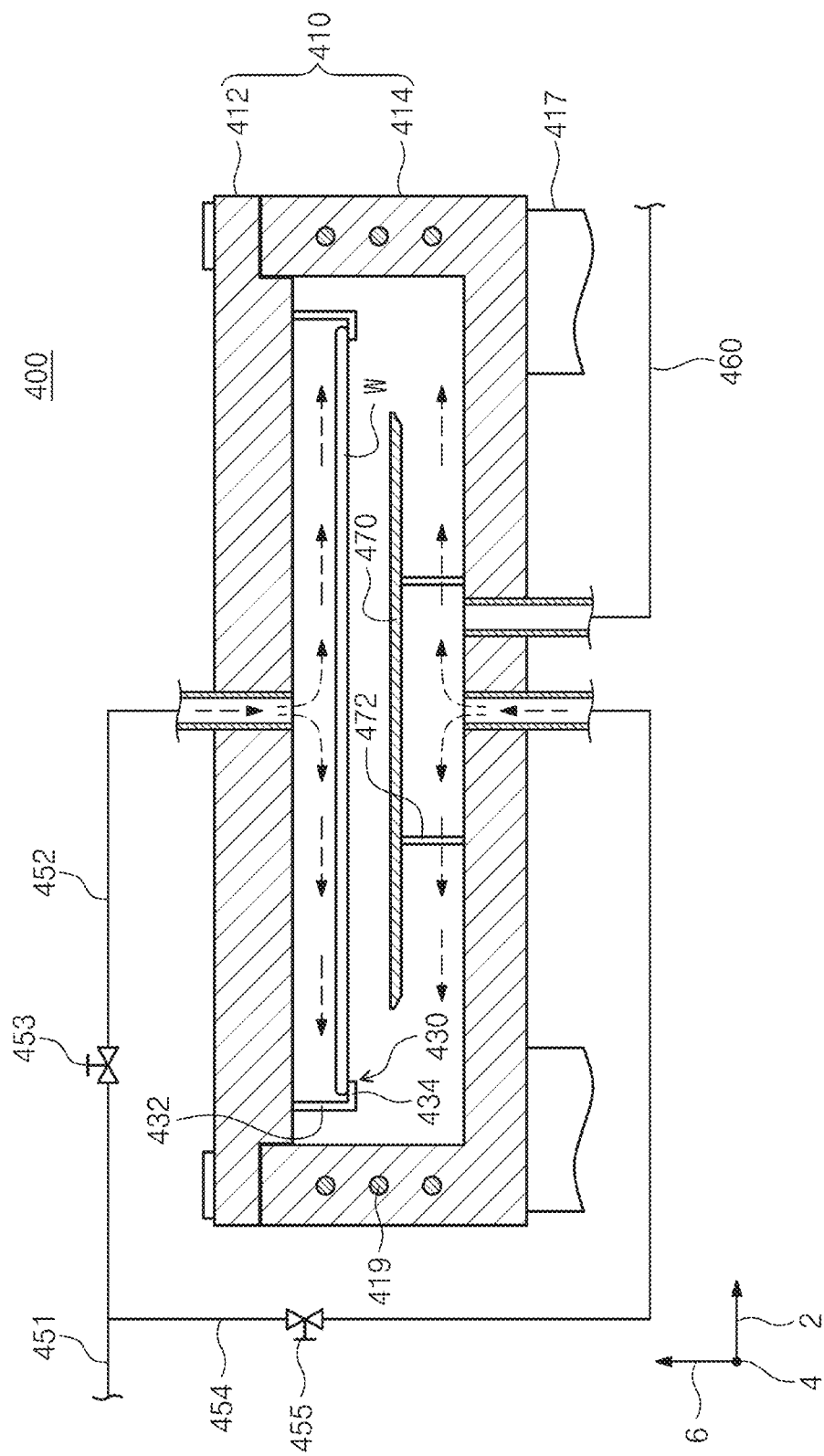

FIGS. 15 and 16 are views schematically illustrating a state in which the substrate is treated in a drying step according to one embodiment of FIG. 4. Referring to FIG. 15, in the drying step S30, the substrate W is dried. In the drying step S30, the substrate W on which the liquid treatment step S10 is completed is dried. For example, in the drying step S30, the second liquid L2 supplied to the substrate W may be removed. The drying step S30 is performed in the drying chamber 400. In the drying step S30, the substrate W is transferred to the support 430 in a state in which the inner space 401 is opened. The substrate W transferred to the support 430 may be the substrate W on which the second induction step S149 is completed.

Referring to FIG. 16, when the substrate W is settled on the support 430, the first body 412 and the second body 414 are in close contact with each other and the inner space 401 is sealed from the outside. For example, when the substrate W is settled on the holder 434 and the rear edge region of the substrate W is supported by the holder 434, the inner space 401 is switched to a sealed state. After the inner space 401 is sealed, the fluid supply unit 450 supplies the process fluid to the inner space 401. According to the exemplary embodiment, the fluid supply unit 450 may supply the supercritical fluid to the inner space 401. The substrate W is dried by supplying the process fluid to the inner space 401. That is, by supplying the process fluid to the inner space 401, the second liquid L2 existing on the upper surface of the substrate W is removed.

After the inner space 401 is sealed, the second valve 455 is opened such that the process fluid maybe previously supplied to the inner space 401 through the second branch line 454. After the process fluid is supplied to the lower region of the inner space 401, the first valve 453 may be opened such that the process fluid may be supplied to the inner space 401 through the first branch line 452.

Since the substrate may be dried at an initial stage in a state in which the inner space 401 is less than a critical pressure, the process fluid supplied to the inner space 401 may be liquefied. When the process fluid is supplied to the inner space 401 through the first branch line 452 at the initial stage of drying the substrate, the process fluid may be liquefied and drop to the substrate W by gravity, resulting in damage to the substrate W. Accordingly, in the drying step S30 according to the exemplary embodiment of the present invention, by previously supplying the process fluid to the inner space 401 through the second branch line 454, after the pressure in the inner space 401 reaches the critical pressure, the process fluid starts to be supplied in the first branch line 452, and then the process fluid supplied to the inner space 401 can be liquefied, thereby minimizing damage to the substrate W.

At a later stage of the drying step S30, an inner atmosphere of the inner space 401 is exhausted through the exhaust line 460. When the pressure in the inner space 401 is reduced below the critical pressure, the process fluid may be liquefied. The liquefied process fluid may be exhausted through the exhaust line 460 by gravity.

When the substrate W is treated with liquid, the liquid supplied to the substrate W has fluidity. In the process of supplying the liquid to the substrate W, the liquid supplied to the substrate W may deviate from the edge region of the substrate W and permeate into the rear surface of the substrate W. It takes a long time for the liquid permeating into the rear surface of the substrate W to be naturally dried. In addition, when the liquid treatment is performed on the substrate W, since the substrate W is generally supported by a support, it is difficult to artificially remove the liquid permeating into the rear surface of the substrate W easily. The liquid permeating into the rear surface of the substrate W acts as a contamination source that contaminates a subsequent substrate when performing the transfer process of the substrate or performing other treatment processes after the transfer.

According to the exemplary embodiment of the present invention described above, while the liquid is supplied to the substrate W to perform the liquid treatment, the rotation speed of the substrate W is changed to minimize the permeation of the liquid into the rear surface of the substrate W. Accordingly, the contamination of the subsequent substrate due to the liquid permeating into the rear surface of the substrate W may be minimized.

Specifically, according to the exemplary embodiment of the present invention, after the liquid treatment is performed on the substrate W in the liquid treatment chamber 300, the liquid treatment is transferred to the drying chamber 400 in which the drying treatment is performed to remove the liquid supplied to the substrate W. In the drying chamber 400, the drying treatment is performed on the substrate W in a state in which the support 430 supports the rear edge region of the substrate W. By suppressing the flow of liquid on the rear surface of the substrate W when the substrate W is treated with liquid, the support 430 may support the rear edge region of the substrate W which has no liquid thereon in the drying chamber 400. Accordingly, a contamination source contaminating a subsequent substrate W that may occur in the drying chamber 400 can be preemptively blocked.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:
1. A method for treating a substrate, the method comprising:
  treating the substrate with liquid; and
  drying the liquid-treated substrate,
  wherein the treating includes,
    supplying a first liquid to an upper surface of the substrate while rotating the substrate, and
    subsequent to the suppling of the first liquid, supplying a second liquid to the upper surface of the substrate while rotating the substrate,
  wherein in the supplying the second liquid, a rotation speed of the substrate is adjusted such that the second liquid supplied on the substrate flows only from a central region of the substrate to an edge region of the substrate,
  wherein the supplying the second liquid includes,
    replacing the first liquid supplied to the substrate with the second liquid, the replacing including,
      rotating the substrate at a first speed, and
      first-providing the second liquid onto the central region of the substrate while rotating the substrate at the first speed for a first time period,
    compensating for an amount of the second liquid supplied to the substrate in the replacing, the compensating including,
      changing the rotation speed of the substrate from the first speed to a second speed slower than the first speed, and
      second-providing the second liquid onto the central region of the substrate while rotating the substrate at the second speed for a second time period, and
    subsequent to the compensating, inducing the second liquid supplied to the substrate to flow only to the edge region of the substrate by changing the rotation speed of the substrate in an induction speed range, the inducing including,
      changing the rotation speed of the substrate from the second speed to a first induction speed slower than the second speed, and third-providing the second liquid to the central region of the substrate while rotating the substrate at the first induction speed for a third time period, changing the rotation speed of the substrate from the first induction speed to a second induction speed slower than the first induction speed, and stopping providing the second liquid to the substrate, and rotating the substrate at the second induction speed for a fourth time period while the second liquid is not provided towards the substrate.

2. The method for treating a substrate of claim 1, wherein the second speed is a speed at which the second liquid supplied to the substrate is restricted from flowing to a rear surface of the substrate.

3. The method for treating a substrate of claim 1, wherein in the supplying the second liquid, the second liquid flows only to an upper edge region of the substrate.

4. The method for treating a substrate of claim 1, wherein the drying is performed by a supercritical fluid, and the second liquid has a higher solubility in the supercritical fluid than the first liquid.

5. The method for treating a substrate of claim 4, wherein the drying is performed in a state in which a rear edge region of the substrate is supported.

6. The method for treating a substrate of claim 1, wherein the treating is performed in a liquid treatment chamber, and the drying is performed in a drying chamber, and the substrate on which the treating is completed in the liquid treatment chamber is transferred to the drying chamber by a transfer robot.

7. A method for treating a substrate, the method comprising:

treating the substrate with liquid by supplying the liquid to the substrate in a liquid treatment chamber;

transferring the liquid-treated substrate to a drying chamber; and removing the liquid from the liquid-treated substrate using a supercritical fluid in the drying chamber, wherein the treating includes, supplying a first liquid to an upper surface of the substrate while rotating the substrate, subsequent to the suppling of the first liquid, supplying a second liquid to an upper surface of the substrate while rotating the substrate, wherein in the supplying of the second liquid, a rotation speed of the substrate is changed from a first speed to a second speed slower than the first speed, from the second speed to a first induction speed slower than the second speed, and from the first induction speed to a second induction speed slower than the first induction speed such that the second liquid supplied to the substrate is induced to flow only to an edge region of the upper surface, the supplying of the second liquid includes stopping the supplying of the second liquid after changing the rotation speed of the substrate from the first induction speed to the second induction speed so that the substrate rotates at the second induction speed while the second liquid is not provided towards the substrate, and wherein the supplying of the second liquid includes supplying the second liquid to the substrate while the substrate rotates at the first speed for a first period of time, supplying the second liquid to the substrate while the substrate rotates at the second speed for a second period of time, and supplying the second liquid to the substrate while the substrate rotates at the first induction speed for a third period of time.

* * * * *